United States Patent [19]
Kao

[11] Patent Number: 5,373,420
[45] Date of Patent: Dec. 13, 1994

[54] CHIP CARRIER FOR FASTENING A CHIP TO A PRINTED CIRCUIT BOARD

[75] Inventor: Chi N. Kao, Hsin Chuang, Taiwan, Prov. of China

[73] Assignee: Kun Yen Electronic Co., Ltd., Hsin Chuang, Taiwan, Prov. of China

[21] Appl. No.: 34,780

[22] Filed: Mar. 19, 1993

[51] Int. Cl.⁵ .......................................... H01R 23/68
[52] U.S. Cl. .................................. 361/785; 361/756; 361/760; 174/52.4; 439/68; 257/690
[58] Field of Search ............... 361/392, 397, 399, 400, 361/413, 415, 420, 785, 752, 756, 760; 439/68, 70, 71; 174/52.4, 261; 257/697, 690, 676

[56] References Cited

U.S. PATENT DOCUMENTS 4,919,623 4/1990 Billman et al. ..................... 439/70
5,114,358 5/1992 Myers ................................ 439/266

Primary Examiner—Leo P. Picard
Assistant Examiner—Young Whang
Attorney, Agent, or Firm—Jones, Tullar & Cooper

[57] ABSTRACT

Disclosed is a chip carrier including a base having terminal slots along the four sides thereof, and terminals each of which having a mounting contact inserted in either terminal slot and a connecting leg disposed out of the respective terminal contact for fastening to a printed circuit board, wherein the base comprises four straight ribs horizontally disposed along the terminal slots at an inner side to keep the connecting leg of every terminal at the same elevation. Each straight rib has grooves spaced corresponding to the terminals slots on tile same side to hold the connecting legs of the terminals in position.

1 Claim, 3 Drawing Sheets

CHIP CARRIER FOR FASTENING A CHIP TO A PRINTED CIRCUIT BOARD

BACKGROUND OF THE INVENTION

The present invention relates to chip carriers, and more particularly the present invention relates to a chip carrier which has terminal calibrating ribs to keep the terminals at the same elevation for accurate and positive fastening to a printed circuit board.

An electronic chip is a precision integrated circuit comprised of resistors, diodes, etc., which may be damaged easily when directly welded to a printed circuit board. Therefore a chip carrier is commonly used to fasten a chip to a printed circuit board. There are two different types of chip carriers which are classified according to their mounting methods, namely, the welding process and the surface mounting technology. The present invention pertains to the surface mounting technology type of chip carriers.

A chip carrier according to the prior art, as shown in FIG. 1, is generally comprised of a base, and terminals. The base is made of plastic by an injection molding process, in the shape of a flat square block, having a series of terminal slots along the four sides thereof, which receive the terminals, and a recessed portion in the middle, which receives the chip. A number of terminals are connected by a connecting strip for quick insertion into the terminal slots on the base at the same side. Each terminal is comprised of a mounting contact and a connecting leg. The mounting contact is inserted in either terminal slot while the respective connecting leg projects out of the respective terminal slot for connecting to the printed circuit board. When inserted, the connecting strip is cut off. After the chip has been mounted on the base, the contacts of the chip are respectively disposed in contact with the mounting contacts of the terminals, and the connecting legs of the terminals are respectively connected to the circuit of the printed circuit board by employing a surface mounting technology. Because the connecting legs of the terminals are suspended out of the terminal slots respectively, they are not in perfect alignment (see FIG. 2) and should be corrected to be maintained at the same elevation so that the tin solder can be evenly distributed over the connecting legs while fastening the terminals to the printed circuit board. However, calibrating the horizontal alignment of the connecting legs is not easy, and requires special techniques and tools. While using a tool to correct the connecting legs of the terminals, the connecting legs may be easily damaged or broken.

SUMMARY OF THE INVENTION

The present invention eliminates the aforesaid problems. It is therefore the main object of the present invention to provide a chip carrier which automatically keeps the connecting legs of the terminals in perfect horizontal alignment without damaging the terminals. This object is achieved by forming horizontal straight ribs on the base of the chip carrier along the terminal slots thereof at an inner side. When the terminals are respectively inserted in the terminal slots, the connecting legs of the terminals become respectively supported on the horizontal straight ribs at the same elevation.

BRIEF DESCRIPTION OF THE PREFERRED EMBODIMENT

DETAILED DESCRIPTION OF THE PREFERRED EMBODIMENT

Figure 2:
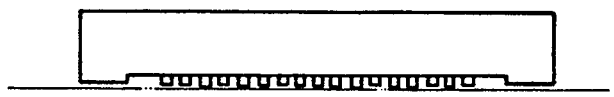
FIG. 2 is a front view of the chip carrier of FIG. 1 showing the connecting legs of the terminals not in alignment.
Figure 1:
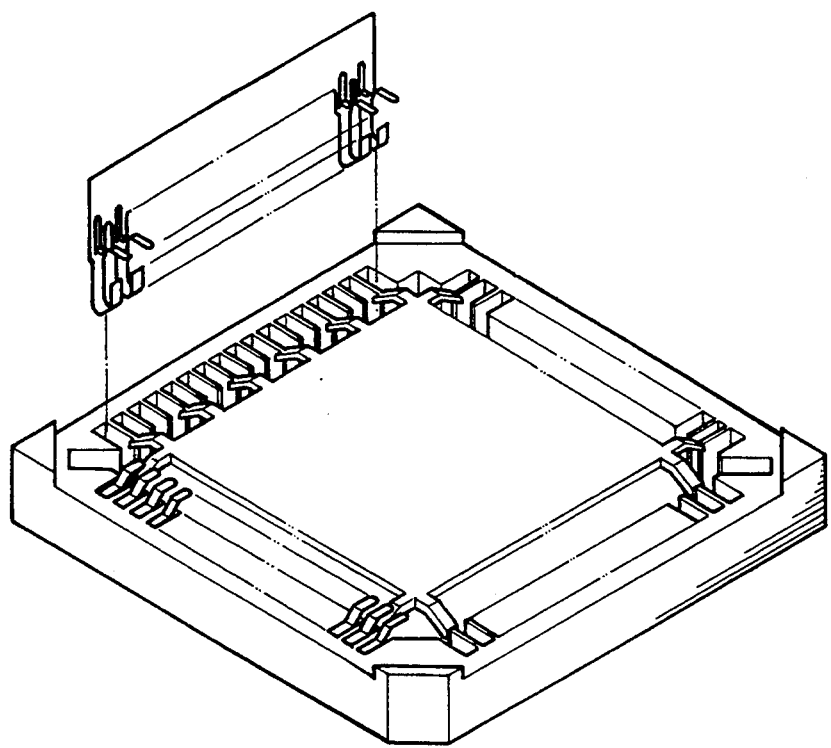
FIG. 1 is a perspective exploded view of a chip carrier constructed according to the prior art.
Figure 3:
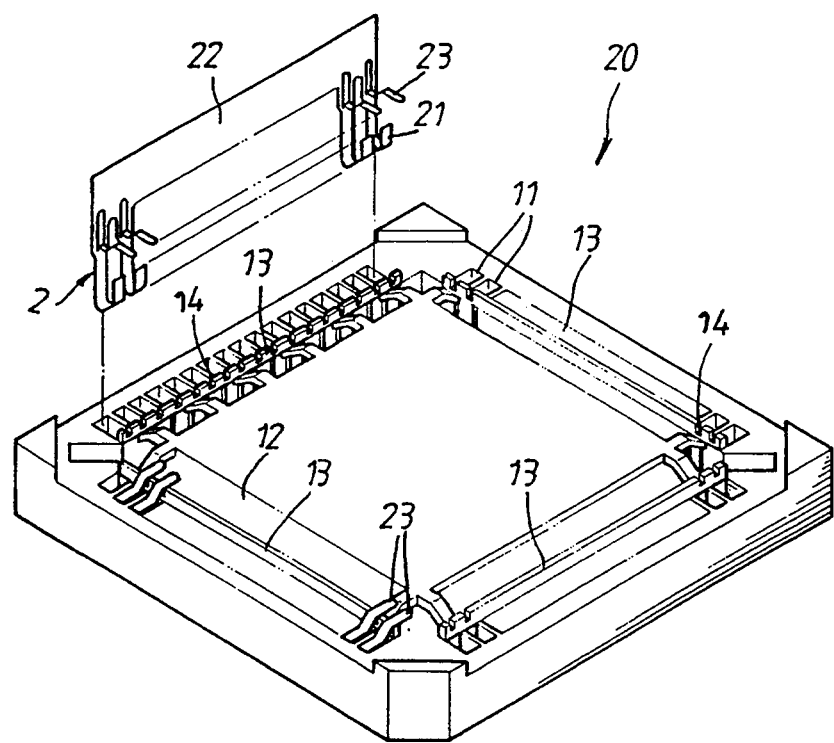
FIG. 3 is a perspective exploded view of a chip carrier constructed according to the present invention.
Figure 4:
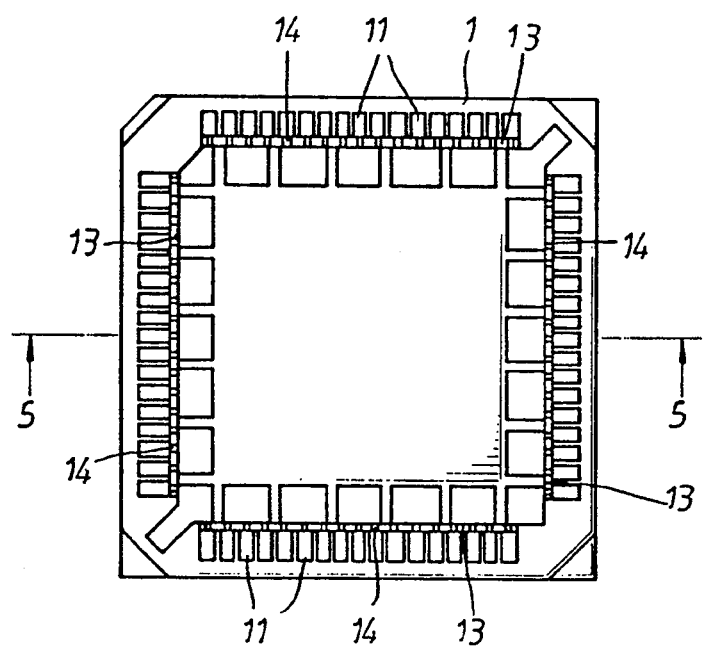
FIG. 4 is a top view of the chip carrier of FIG. 3 when the terminals are removed.

Referring to FIGS. 3 and 4, a chip carrier 20 constructed in accordance with the preferred embodiment of the present invention is generally comprised of a base 1, and terminals 2. The base 1 is made of plastic by an injection molding process, in the shape of a flat square block, having series of terminal slots 11 along the four sides thereof, into which a mounting contact 21 oil either terminal 2 is inserted, and a recessed portion 12 in the middle, which receives the chip. A number of terminals 2 are connected by a connecting strip 22 for quick insertion into the terminal slots 11 on the base 1 at the same side. Each terminal 2 consists of the mounting contact 21 and a connecting leg 23. The mounting contact 21 is inserted in either terminal slot 11 while the respective connecting leg 23 projects out of the respective terminal slot 11 for connecting to the printed circuit board. After the chip has been mounted on the base 1, the contacts of the chip are respectively disposed in contact with the mounting contacts 21 of the terminals 2, and the connecting leg 23 of the terminals 2 are respectively connected to the circuit of the printed circuit board by employing a surface mounting technology.

Figure 5:
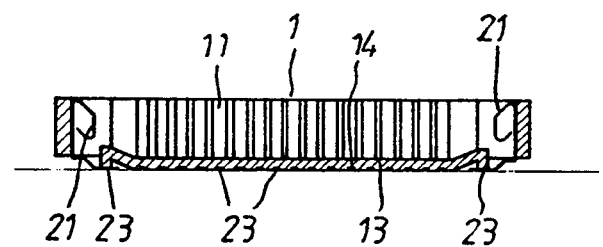
FIG. 5 is a cross section taken along line 5—5 of FIG. 4, showing the connecting legs of the terminals in perfect alignment.

Referring to FIG. 5 and FIGS. 3 and 4 again, the main feature of the present invention is outlined hereinafter with reference to FIGS. 3 and 4 again. There are four straight ribs 13 integrally formed on the base 1 and horizontally disposed along the terminal slots 11 at an inner side adjacent to a recessed portion, which serve as automatic calibration lines to keep respective connecting legs 23 at the same elevation (see FIG. 5). Therefore, the chip carrier 20 is maintained perfectly horizontal when mounted on the printed circuit board, permitting the tin solder to be evenly distributed over every connecting leg 23 without causing any error. Each straight rib 13 comprises a series of grooves 14 spaced corresponding to the terminal slots 11 on either side. The depth of the grooves 14 is relatively shorter than the diameter of the connecting legs 23, for example: the depth of the grooves 14 is about 0.15 m/m, and the connecting legs 23 have a 0.2 m/m diameter. When a connecting leg 23 is inserted into the respective groove 14 on the respective straight rib 13, its outer wall will project out of the respective groove 14 for fastening to the printed circuit board by employing a surface mounting technology. The width of the grooves 14 is slightly greater than the diameter of the connecting legs 23 so that the connecting legs 23 can be conveniently inserted into the respective grooves 14. The arrangement of the grooves 14 on the straight ribs 13 are intended to receive the connecting legs 23, and to keep them straight.

As indicated, tile present invention provides a chip carrier having terminal calibrating ribs to keep terminals in perfect alignment automatically for easy and accurate application of the tin solder without damaging the terminals.

While only an embodiment of the present invention has been shown and described, it will be understood that various modifications and changes could be made without departing from the spirit and scope of the invention.

What is claimed is:

1. A chip carrier for fastening a chip to a printed circuit board, comprising: a base made in a shape of a flat square block having series of terminal slots along four sides thereof and four straight ribs horizontally disposed along said terminal slots; and a plurality of terminals each inserted in a respective one of said terminal slots, each terminal comprising a mounting contact inserted in either terminal slot on said base and a connecting leg extended out of the respective terminal slot and respectively fastened to a printed circuit board, wherein said straight ribs are horizontally disposed at an inner side to keep the connecting leg of every terminal at the same elevation, each straight rib comprises a series of grooves spaced corresponding to the terminal slots on the same side to hold the connecting legs of the respective terminals in position, and each groove on either straight rib has a depth slightly shorter than a diameter of the connecting leg, and a width slightly longer than a diameter of the connecting leg.

* * * * *